United States Patent
Chiang et al.

(10) Patent No.: US 9,117,705 B2
(45) Date of Patent: Aug. 25, 2015

(54) THIN-FILM TRANSISTOR ACTIVE DEVICE

(71) Applicant: Shenzhen China Star Optoelectronics Technology Co., LTD., Shenzhen, Guangdong Province (CN)

(72) Inventors: Chenglung Chiang, Shenzhen (CN); Polin Chen, Shenzhen (CN)

(73) Assignee: Shenzhen China Star Optoelectronics Technology Co., Ltd., Shenzhen, Guangdong Province (CN)

(*) Notice: Subject to any disclaimer, the term of this patent is extended or adjusted under 35 U.S.C. 154(b) by 98 days.

(21) Appl. No.: 13/806,718

(22) PCT Filed: Sep. 21, 2012

(86) PCT No.: PCT/CN2012/081707
§ 371 (c)(1),
(2) Date: Dec. 21, 2012

(87) PCT Pub. No.: WO2014/040305
PCT Pub. Date: Mar. 20, 2014

(65) Prior Publication Data
US 2014/0197404 A1     Jul. 17, 2014

(30) Foreign Application Priority Data
Sep. 11, 2012 (CN) .......................... 2012 1 0334414

(51) Int. Cl.
H01L 29/12     (2006.01)
H01L 27/12     (2006.01)
H01L 23/552    (2006.01)
H01L 29/49     (2006.01)
H01L 29/66     (2006.01)
H01L 29/786    (2006.01)
H01L 23/556    (2006.01)

(52) U.S. Cl.
CPC .......... *H01L 27/1225* (2013.01); *H01L 23/552* (2013.01); *H01L 29/4908* (2013.01); *H01L 29/66969* (2013.01); *H01L 29/7869* (2013.01);
(Continued)

(58) Field of Classification Search
CPC ........................... H01L 23/552; H01L 23/556
USPC ...................................................... 257/43, 59
See application file for complete search history.

(56) References Cited

U.S. PATENT DOCUMENTS

2004/0027928 A1* 2/2004 Awano et al. .............. 369/13.08
2005/0250198 A1* 11/2005 Fujimura et al. ........... 435/287.2
(Continued)

FOREIGN PATENT DOCUMENTS

CN     1591778 A      3/2005
CN     101626036 A    1/2010
(Continued)

*Primary Examiner* — Long K Tran
(74) *Attorney, Agent, or Firm* — Cheng-Ju Chiang

(57) ABSTRACT

The present invention relates to a thin-film transistor (TFT) active device. The TFT active device includes: a gate electrode; a gate insulation layer covering the gate electrode; an oxide semiconductor layer formed on the gate insulation layer; a first protection layer formed on the oxide semiconductor layer; a source/drain electrode electrically connected with the oxide semiconductor layer; and a second protection layer covering the source/drain electrode. At least one of the gate insulation layer, the first protection layer, and the second protection layer is made of a nitride of silicon and has a refractive index between 2.0-3.0. The TFT active device according to the present invention helps suppressing diffusion of metal ions from a metal electrode and reducing hydrogen content of the GI layer, the ES layer, or the PV layer so as to effectively improve the stability of the manufacture operation of TFT.

18 Claims, 4 Drawing Sheets

(52) U.S. Cl.
CPC ......... H01L 29/78606 (2013.01); *H01L 23/556* (2013.01)

(56) References Cited

U.S. PATENT DOCUMENTS

2007/0096641 A1*  5/2007  Hasegawa et al. ............ 313/504
2010/0184302 A1*  7/2010  Lee et al. ...................... 438/792
2011/0014795 A1*  1/2011  Lee et al. ...................... 438/761
2011/0037134 A1*  2/2011  Sugino et al. ................. 257/432
2014/0183509 A1*  7/2014  Ikeda et al. ..................... 257/40

FOREIGN PATENT DOCUMENTS

CN  102610618 A  7/2012
TW  201234433 A1  8/2012

* cited by examiner

THIN-FILM TRANSISTOR ACTIVE DEVICE

BACKGROUND OF THE INVENTION

1. Field of the Invention

The present invention relates to the technical field of flat panel display device, and in particular to a thin-film transistor (TFT) active device.

2. The Related Arts

In an active matrix flat panel display, each pixel point is driven by a thin-film transistor (TFT) active device integrated on the rear side of the pixel point so as to achieve displaying screen message in high speed, high brightness, and high contrast. Each pixel point of the active matrix flat panel display is controlled by the TFT integrated therewith and is thus an active pixel point, whereby the speed is greatly increased and contrast and brightness are both significantly improved and at the same time, the resolution may reach a very high level. For the whole device of flat panel display, the TFTs (matrix) may apply active control over each independent pixel of the screen. This is the origin of the term "active matrix TFT". The active matrix flat panel display has effectiveness that is close to a CRT display and is the main stream displays for modern notebook computers and desktop computers.

Referring to FIG. 1, a flow of a typical manufacture process of an oxide semiconductor TFT having an etch stop layer structure is shown, structures that can be formed in the same manufacture step bear the same cross hatching in the drawing. An oxide semiconductor TFT is a technique based on TFT driving that arranges a metal oxide active layer on a gate insulation layer of TFT. The oxide active layer is preferably an IGZO layer, wherein IGZO is an abbreviation standing for indium gallium zinc oxide. According to the flow of manufacture process shown in FIG. 1, a gate electrode (GE) 10 is first formed on a substrate. Next, a gate insulation (GI) layer 11 is formed on and covers the gate electrode 10. Then, an oxide semiconductor layer 12, which is specifically an IGZO layer, is formed on the gate insulation layer 11. Then, an etch stop (ES) layer 13 is formed on the oxide semiconductor layer 12. The ES layer is often formed through chemical vapor deposition (CVD) of a precursor substance. Afterwards, a source/drain (S/D) electrode 14 is formed to electrically connect with the oxide semiconductor layer 12 and etching is applied to form source electrode and drain electrode respectively. Next, a passivation (PV) layer 15 is formed to cover the source/drain electrode 14. To this point, a TFT active device that is composed of the gate electrode 10, the gate insulation layer 11, the oxide semiconductor layer 12, the etch stop layer 13, the source/drain electrode 14, and the passivation layer 15 is completed. Further, in the flow of manufacture process shown in FIG. 1, a subsequent operation is forming an indium tin oxide (ITO) electrode 16 to serve as a pixel electrode to eventually form a TFT applicable to an active matrix flat panel display.

Referring to FIG. 2, a schematic view is given to show a typical TFT active device manufactured with oxide semiconductor TFT by means of copper process is given. The TFT active device generally comprises a gate terminal, a gate insulation layer 21, an oxide semiconductor layer 22, an etch stop layer 23, a source/drain electrode 24, and a passivation layer 25. The oxide semiconductor layer 22 is formed on the gate insulation layer 21. The etch stop layer 23 is formed on the oxide semiconductor layer 22. The source/drain electrode 24 is electrically connected to the oxide semiconductor layer 22. The passivation layer 25 covers the source/drain electrode 24. In the copper process, to avoid penetration of copper ions, a barrier layer 27 must be first deposited before copper is deposited and the current solution includes Mo, Ti, or similar alloys or compounds. Although the barrier layer 27 is arranged between the source/drain electrode 24 and the oxide semiconductor layer 22 and the etch stop layer 23, yet Cu ions may still easily penetrate the passivation layer 25 and the etch stop layer 23 to diffuse into the oxide semiconductor layer 22, causing abnormalities, such as threshold voltage shift, mobility down, and sub-threshold swing degradation.

Referring to FIG. 3, a plot is given for comparison of gate voltage ($V_G$)-drain current ($I_D$) characteristic curves before and after air annealing adopted in a conventional manufacture process that uses IGZO TFT in combination with copper process. The plot is copied from JJAP 51 (2012) 011401. After the air annealing, the effect of copper ion diffusion significantly alert the gate voltage ($V_G$)-drain current ($I_D$) characteristic curve, namely causing abnormalities such as threshold voltage shift, mobility down, and sub-threshold swing degradation.

As shown in the following Table 1, a comparison is given for materials of GI/ES/PV layers that are commonly used in the manufacture process that uses oxide semiconductor TFT in combination with copper process. One case uses $SiO_x$ as an insulation material, wherein $SiH_4+N_2O$ is used as a precursor for CVD and forms the GI/ES/PV layers through CVD to provide TFT of excellent properties, but copper ions may easily diffuse. Another case uses $SiN_x$ as an insulation material, wherein $SiH_4+NH_3+N_2$ is used as a precursor for CVD and forms the GI/ES/PV layers through CVD, wherein the insulation material contains relatively high contents of hydrogen and the TFT obtained does not show good property, but copper ions may not easily diffuse.

TABLE 1

Comparison for conventionally used materials of GI/ES/PV layers

| Material of GI/ES/PV Layer | CVD Precursor | TFT Property | Copper Ion Resistance |
|---|---|---|---|
| $SiO_x$ | $SiH_4 + N_2O$ | Good | Poor |
| $SiN_x$ | $SiH_4 + NH_3 + N_2$ | Poor | Good |

Thus, the conventional manufacture process using oxide semiconductor TFT in combination with copper process will face dual influences of diffusion of metal ions from metal electrodes and H contents of GI/ES/PV layers. Both factors are keys that control the stability of the TFT device.

SUMMARY OF THE INVENTION

Thus, an object of the present invention is to provide a thin-film transistor active device, which suppresses the diffusion of metal ions and reduces hydrogen contents in insulation layers and protection layers.

To achieve the objective, the present invention provides a TFT active device, which comprises:

a gate electrode;

a gate insulation layer covering the gate electrode;

an oxide semiconductor layer formed on the gate insulation layer;

a first protection layer formed on the oxide semiconductor layer;

a source/drain electrode electrically connected with the oxide semiconductor layer; and a second protection layer covering the source/drain electrode;

wherein at least one of the gate insulation layer, the first protection layer, and the second protection layer is made of a nitride of silicon and has a refractive index between 2.0-3.0.

The oxide semiconductor layer comprises at least one of an oxide of Zn, an oxide of Sn, an oxide of In, and an oxide of Ga.

The source/drain electrode comprises Cu or Al.

The first protection layer is arranged between the oxide semiconductor layer and the source/drain electrode.

The nitride of silicon is formed by applying plasma enhanced chemical vapor deposition to a mixed gas having a flow ratio of $N_2/(N_2+SiH_4)$ between 0.7-0.9.

The nitride of silicon has hydrogen content less than 5 atom %.

The first protection layer is an etch stop layer.

The second protection layer is a passivation layer.

The oxide semiconductor layer is an IGZO layer.

The TFT active device is a thin-film transistor of TFT-LCD.

The present invention also provides a TFT active device, which comprises:

a gate electrode;

a gate insulation layer covering the gate electrode;

an oxide semiconductor layer formed on the gate insulation layer;

a first protection layer formed on the oxide semiconductor layer;

a source/drain electrode electrically connected with the oxide semiconductor layer; and a second protection layer covering the source/drain electrode;

wherein at least one of the gate insulation layer, the first protection layer, and the second protection layer is made of a nitride of silicon and has a refractive index between 2.0-3.0;

wherein the oxide semiconductor layer comprises at least one of an oxide of Zn, an oxide of Sn, an oxide of In, and an oxide of Ga;

wherein the source/drain electrode comprises Cu or Al;

wherein the first protection layer is arranged between the oxide semiconductor layer and the source/drain electrode;

wherein the nitride of silicon is formed by applying plasma enhanced chemical vapor deposition to a mixed gas having a flow ratio of $N_2/(N_2+SiH_4)$ between 0.7-0.9;

wherein the nitride of silicon has hydrogen content less than 5 atom %;

wherein the first protection layer is an etch stop layer;

wherein the second protection layer is a passivation layer;

wherein the oxide semiconductor layer is an IGZO layer; and wherein the TFT active device is a thin-film transistor of TFT-LCD.

For a TFT having a BCE (Back Channel Etched) structure, the present invention also provides a TFT active device, which comprises:

a gate electrode;

a gate insulation layer covering the gate electrode;

an oxide semiconductor layer formed on the gate insulation layer;

a source/drain electrode electrically connected with the oxide semiconductor layer; and a protection layer covering the source/drain electrode;

wherein at least one of the gate insulation layer and the protection layer is made of a nitride of silicon and has a refractive index between 2.0-3.0.

The oxide semiconductor layer comprises at least one of an oxide of Zn, an oxide of Sn, an oxide of In, and an oxide of Ga.

The source/drain electrode comprises Cu or Al.

The nitride of silicon is formed by applying plasma enhanced chemical vapor deposition to a mixed gas having a flow ratio of $N_2/(N_2+SiH_4)$ between 0.7-0.9.

The nitride of silicon has hydrogen content less than 5 atom %.

The oxide semiconductor layer is an IGZO layer.

The TFT active device is a thin-film transistor of TFT-LCD.

The present invention provides a thin-film transistor active device, which help suppressing diffusion of metal ions from a metal electrode and reducing hydrogen content of an insulation layer and a protection layer so as to effectively improve the stability of TFT manufacture operation.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 1:
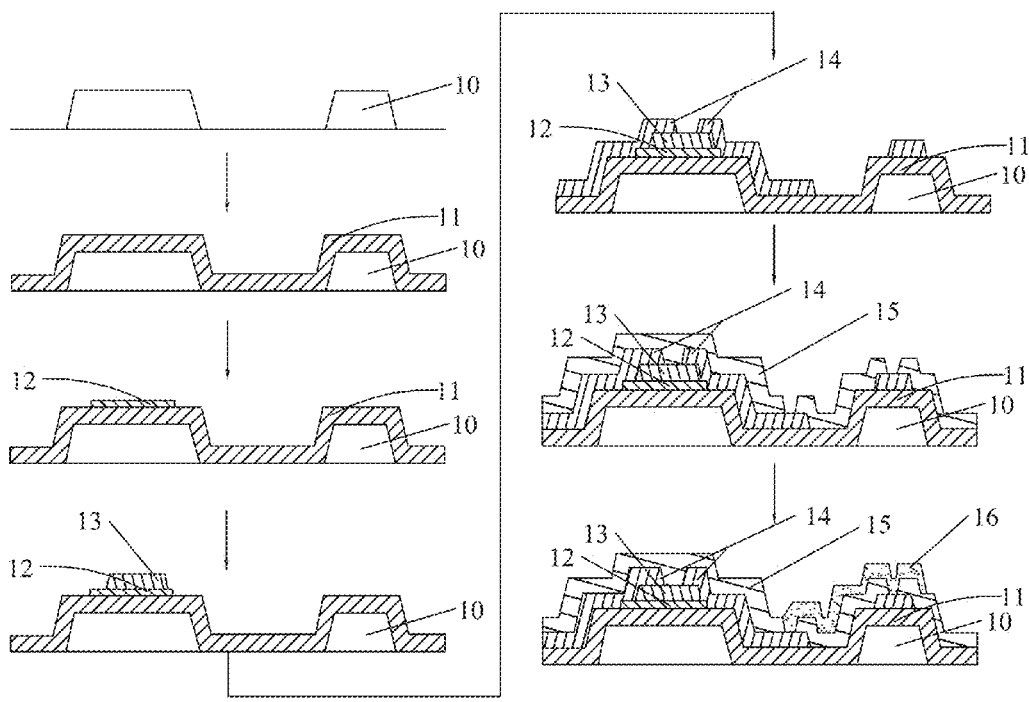
FIG. 1 shows a flow of a typical conventional manufacture process of an oxide semiconductor thin-film transistor (TFT) having an etch stop layer structure.
Figure 2:
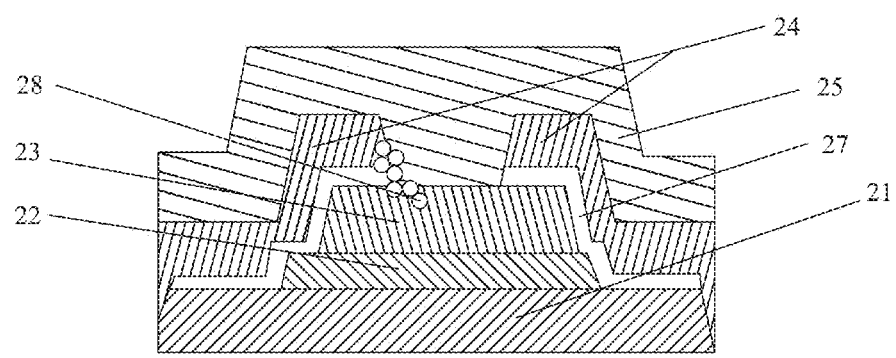
FIG. 2 is a schematic view showing a typical TFT active device manufactured with oxide semiconductor TFT by means of copper process.
Figure 3:
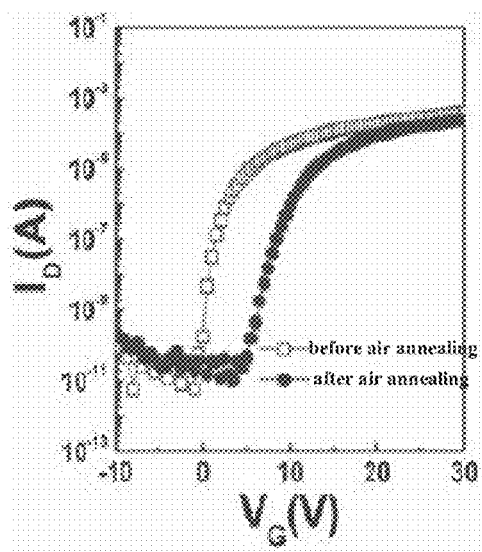
FIG. 3 is a plot for comparison of gate voltage ($V_G$)-drain current ($I_D$) characteristic curves before and after air annealing adopted in a conventional manufacture process that uses IGZO TFT in combination with copper process.
Figure 4:
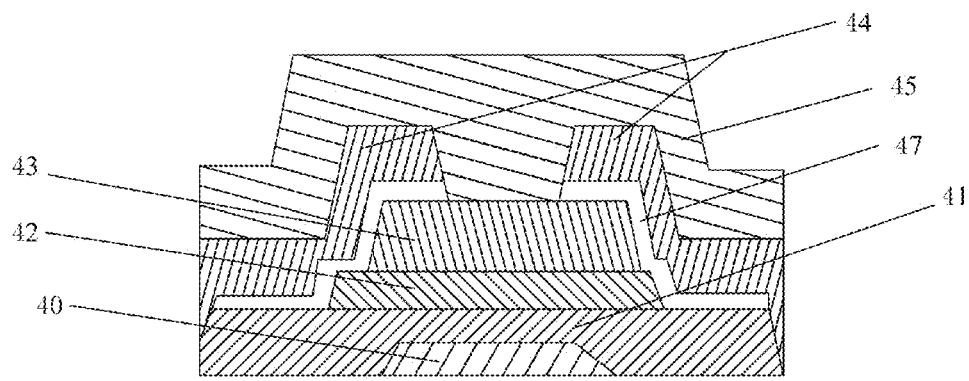
FIG. 4 is a schematic view showing the structure of a TFT active device according to a preferred embodiment of the present invention.

Referring to FIG. 4, a schematic view is given to show the structure of a thin-film transistor (TFT) active device according to a preferred embodiment of the present invention. The TFT active device according to the present invention generally comprises a gate electrode 40; a gate insulation layer 41 covering the gate electrode 40; an oxide semiconductor layer 42 formed on the gate insulation layer 41; a first protection layer 43 formed on the oxide semiconductor layer 42; a source/drain electrode 44 electrically connected with the oxide semiconductor layer 42; and a second protection layer 45 covering the source/drain electrode 44. At least one of the gate insulation layer 41, the first protection layer 43, and the second protection layer 45 is made of silicon nitride and has a refractive index of 2.0-3.0. Further, arranged between the source/drain electrode 44 and the oxide semiconductor layer 42 and the first protection layer 43 is a barrier layer 47 for preventing reaction from occurring between the source/drain metal electrode and the oxide semiconductor layer.

The oxide semiconductor layer 42 may comprises at least one of oxides of Zn, oxides of Sn, oxides of In, and oxides of Ga, such as comprising at least one of $ZnO_x$, $SnO_x$, $InO_x$, and $GaO_x$. The oxide semiconductor layer 42 is preferably an IGZO layer. The source/drain electrode 44 may comprise Cu or Al. The first protection layer 43 is preferably a etch stop layer. The second protection layer 45 is preferably a passivation layer. The first protection layer 43 is located between the oxide semiconductor layer 42 and the source/drain electrode 44. Thus, the TFT active device may be used to a thin-film transistor for driving TFT-LCD.

To suppress diffusion of metal ions and reduces hydrogen content of the GI layer, the ES layer, or the PV layer, the present invention proposes using $NH_3$-free silicon nitride to make the GI layer, the ES layer, or the PV layer. The manufacture can be realized by applying plasma enhanced chemical vapor deposition to a mixed gas of $SiH_4+N_2$. The composition of the GI layer, the ES layer, or the PV layer is silicon nitride and can effectively suppress the diffusion of metal ions and using $N_2$ to replace the conventionally used $NH_3$ can effectively reduce the influence of hydrogen content. The hydrogen content of the silicon nitride used is preferably less than 5 atom %.

Figure 5:
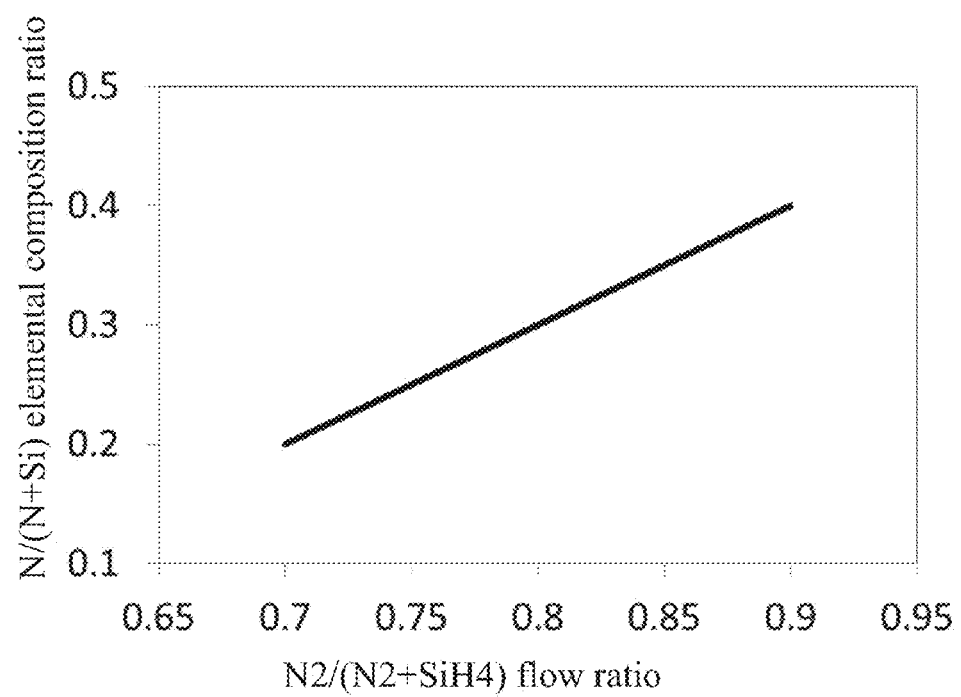
FIG. 5 is a plot showing the relationship between the elemental composition ratio of N/(N+Si) of silicon nitride and material flow ratio.
Figure 6:
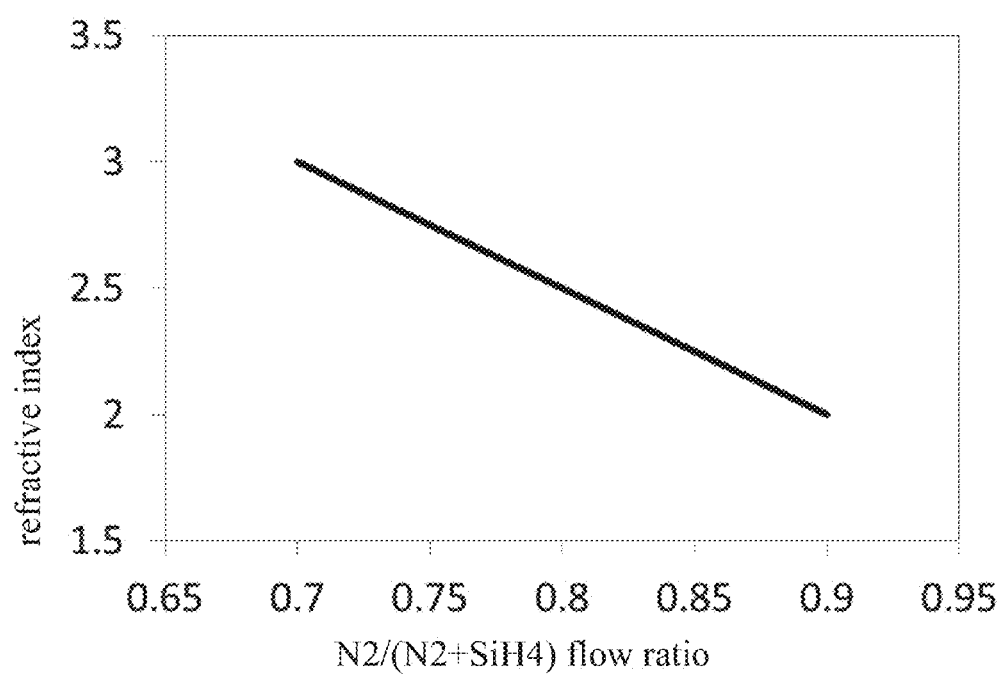
FIG. 6 is a plot showing the relationship between refractive index of silicon nitride and material flow ratio.

Referring to FIGS. 5 and 6, FIG. 5 is a plot showing the relationship between the elemental composition ratio of N/(N+Si) of silicon nitride and material flow ratio and FIG. 6 is a plot showing the relationship between refractive index of silicon nitride and material flow ratio. With the material flow ratio of $N_2/(N_2+SiH_4)$ getting lowered, the nitrogen content of the deposited silicon nitride shows linear decrease. If the flow ratio of $N_2/(N_2+SiH_4)$ is lowered to be less than 0.7, the elemental composition ratio of N/(N+Si) of silicon nitride gets less than 0.2. Excessively low content of nitrogen would lead to poor insulation property of the silicon nitride film. If the flow ratio of $N_2/(N_2+SiH_4)$ increased to be greater than 0.9, then the deposition speed of silicon nitride becomes excessively low, making it impractical to use. Thus, a preferable flow ratio of $N_2/(N_2+SiH_4)$ is 0.7-0.9. In FIG. 6, abscissa indicates material flow ratio of $N_2/(N_2+SiH_4)$ and ordinate indicates refractive index n of silicon nitride at 633 nm. The present invention uses refractive index to constrain the characteristic of the silicon nitride layer. According to FIGS. 5 and 6, the preferable flow ratio of $N_2/(N_2+SiH_4)$ is 0.7-0.9, where the refractive index n of the GI/ES/PV layer made of silicon nitride is 2.0-3.0.

It is understood that the present invention is equally applicable to a TFT of BCE (Back Channel Etched) structure.

In summary, the present invention provides a TFT active device, which suppresses diffusion of metal ions from a metal electrode and reduces the hydrogen content of the GI layer, the ES layer, or the PV layer so as to effectively improve the stability of the manufacture operation of TFT.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) active device, comprising:
a gate electrode;
a gate insulation layer covering the gate electrode;
an oxide semiconductor layer formed on the gate insulation layer;
a first protection layer formed on the oxide semiconductor layer;
a source/drain electrode made of a metallic material electrically connected with the oxide semiconductor layer; and
a second protection layer covering the source/drain electrode;
wherein the gate insulation layer and at least one of the first protection layer and the second protection layer are each made of a nitride of silicon having a refractive index greater than 2.0 and less than 3.0 and sandwich the oxide semiconductor layer between the first and the second protection layer and the gate insulation layer to suppress diffusion of metal ions from the source/drain electrode.

2. The TFT active device as claimed in claim 1, wherein the oxide semiconductor layer comprises at least one of an oxide of Zn, an oxide of Sn, an oxide of In, and an oxide of Ga.

3. The TFT active device as claimed in claim 1, wherein the source/drain electrode comprises Cu or Al.

4. The TFT active device as claimed in claim 1, wherein the first protection layer is arranged between the oxide semiconductor layer and the source/drain electrode.

5. The TFT active device as claimed in claim 1, wherein the nitride of silicon is formed by applying plasma enhanced chemical vapor deposition to a mixed gas having a flow ratio of $N_2/(N_2+SiH_4)$ between 0.7-0.9.

6. The TFT active device as claimed in claim 1, wherein the nitride of silicon has hydrogen content less than 5 atom %.

7. The TFT active device as claimed in claim 1, wherein the first protection layer is an etch stop layer.

8. The TFT active device as claimed in claim 1, wherein the second protection layer is a passivation layer.

9. The TFT active device as claimed in claim 1, wherein the oxide semiconductor layer is an IGZO layer.

10. The TFT active device as claimed in claim 1, wherein the TFT active device is a thin-film transistor of TFT-LCD (Liquid Crystal Display).

11. A thin-film transistor (TFT) active device, comprising:
a gate electrode;
a gate insulation layer covering the gate electrode;
an oxide semiconductor layer formed on the gate insulation layer;
a first protection layer formed on the oxide semiconductor layer;
a source/drain electrode made of a metallic material electrically connected with
the oxide semiconductor layer; and
a second protection layer covering the source/drain electrode;
wherein the gate insulation layer and at least one of the first protection layer and the second protection layer are each made of a nitride of silicon having a refractive index greater than 2.0 and less than 3.0 and sandwich the oxide semiconductor layer between the first and the second protection layer and the gate insulation layer to suppress diffusion of metal ions from the source/drain electrode;
wherein the oxide semiconductor layer comprises at least one of an oxide of Zn, an oxide of Sn, an oxide of In, and an oxide of Ga;
wherein the source/drain electrode comprises Cu or Al;
wherein the first protection layer is arranged between the oxide semiconductor layer and the source/drain electrode;
wherein the nitride of silicon is formed by applying plasma enhanced chemical vapor deposition to a mixed gas having a flow ratio of $N_2/(N_2+SiH_4)$ between 0.7-0.9;
wherein the nitride of silicon has hydrogen content less than 5 atom %;
wherein the first protection layer is an etch stop layer;
wherein the second protection layer is a passivation layer;
wherein the oxide semiconductor layer is an IGZO layer; and
wherein the TFT active device is a thin-film transistor of TFT-LCD (Liquid Crystal Display).

12. A thin-film transistor (TFT) active device, comprising:
a gate electrode;
a gate insulation layer covering the gate electrode;

an oxide semiconductor layer formed on the gate insulation layer;
a source/drain electrode made of a metallic material electrically connected with the oxide semiconductor layer; and
a protection layer covering the source/drain electrode;
wherein the gate insulation layer and the protection layer are each made of a nitride of silicon having a refractive index greater than 2.0 and less than 3.0 and sandwich the oxide semiconductor layer between the protection layer and the gate insulation layer to suppress diffusion of metal ions from the source/drain electrode.

13. The TFT active device as claimed in claim 12, wherein the oxide semiconductor layer comprises at least one of an oxide of Zn, an oxide of Sn, an oxide of In, and an oxide of Ga.

14. The TFT active device as claimed in claim 12, wherein the source/drain electrode comprises Cu or Al.

15. The TFT active device as claimed in claim 12, wherein the nitride of silicon is formed by applying plasma enhanced chemical vapor deposition to a mixed gas having a flow ratio of $N_2/(N_2+SiH_4)$ between 0.7-0.9.

16. The TFT active device as claimed in claim 12, wherein the nitride of silicon has hydrogen content less than 5 atom %.

17. The TFT active device as claimed in claim 12, wherein the oxide semiconductor layer is an IGZO layer.

18. The TFT active device as claimed in claim 12, wherein the TFT active device is a thin-film transistor of TFT-LCD (Liquid Crystal Display).

* * * * *